United States Patent [19]

Natarajan

[11] Patent Number: 5,099,431
[45] Date of Patent: Mar. 24, 1992

[54] AUTOMATED RE-WORK SHOP ORDER SCHEDULING SYSTEM

[75] Inventor: Bharath Natarajan, Marietta, Ga.

[73] Assignee: International Business Machines Corporation, Armonk, N.Y.

[21] Appl. No.: 425,611

[22] Filed: Oct. 23, 1989

[51] Int. Cl.[5] .............................................. G06F 15/46
[52] U.S. Cl. .................................... 364/468; 364/401
[58] Field of Search ............... 364/468, 401, 402, 403, 364/513, 149-151, 156, 200 MS File, 900 MS File

[56] References Cited

U.S. PATENT DOCUMENTS

| | | | |
|---|---|---|---|
| 3,703,725 | 11/1972 | Gomersall et al. | 364/468 X |
| 4,648,023 | 3/1987 | Powell | 364/468 X |
| 4,796,194 | 1/1989 | Atherton | 364/468 |
| 4,807,108 | 2/1989 | Ben-Arieh et al. | 364/468 X |
| 4,852,001 | 7/1989 | Tsushima et al. | 364/468 X |
| 4,866,628 | 9/1989 | Natarajan | 364/468 |

Primary Examiner—Joseph Ruggiero
Attorney, Agent, or Firm—Andrew J. Dillon

[57] ABSTRACT

A computer implemented system analyzes shop dispatch rules using current status and a simulation system for the shop floor to establish the dispatch rules to be used to minimize tardiness. When re-work orders are introduced into the system, the shop floor orders have to compete for the same resources, and so the sequence for dispatch may have to be modified to meet the new demands on the shop floor resources. The system provides the capability such that minimum impact is felt on existing orders while maintaining management objectives. The system provides feedback to the user and the up-stream planning system if major changes need to be made on the shop floor schedules. The system develops revised dispatch rules to be followed and the associated sequence of operations to be followed after the introduction of re-work shop orders. The approach taken is repeated interactively and forms what may be characterized as a "bottoms up" approach to analyze the floor schedule taking into consideration the re-work orders and feeds the information to the original planning process. The system automatically creates a list of alternative processes that any production order can follow and establishes optimum process flows in the event of introduction of re-work shop orders. The system automatically passes the information to the planning system which then re-calculates the revised order release sequence for the remaining orders in the release process.

5 Claims, 3 Drawing Sheets

AUTOMATED RE-WORK SHOP ORDER SCHEDULING SYSTEM

CROSS-REFERENCE TO RELATED APPLICATION

The subject matter of this application is related to application Ser. No. 07/127,334 filed on Dec. 1, 1987, by B. Natarajan for "Automated Production Release System", U.S. Pat. No. 4,887,218, which is assigned to a common assignee with this application. The disclosure of that application is incorporated herein by reference.

BACKGROUND OF THE INVENTION

1. Field of the Invention

The present invention generally relates to a computer based re-work shop order scheduling system on the manufacturing shop floor and, more particularly, to a system which automatically interfaces a production dispatch system and a production planning system to provide an integrated approach to a manufacturing software design. The invention provides an easy to use, user friendly interface for the shop foreman to schedule re-work orders along with regular orders in the most efficient way, considering possible production stoppages for other existing shop orders. This invention deals with re-work shop orders, whereas the above-referenced copending application deals with releasable orders for dispatch on the shop floor.

2. Description of the Prior Art

The process of designing, developing and manufacturing a new product, or making major changes to existing products, presents many challenges to product managers and manufacturing managers to bring a product to market for the least cost, within schedule, while maintaining product quality. In today's highly competitive industries, product managers and manufacturing managers require information to address many problems that arise because of the complexity of new products and the complexity of world-wide production and the changing nature of competition. The requirement that products be manufactured for the least possible cost is important in all industries. Of all the costs associated with selling products and services, none is more important than the cost of customer service. When customers require items to be reworked, or field returns, those orders require special attention and sometimes urgent attention which compete for resources on the shop floor with regular orders. The requirement that products be manufactured in as short a period as possible while maintaining a low level of inventory on the shop floor to meet customer needs presents conflicting criteria to be analyzed in order to make timely decisions.

Many authors have written books in the field of production management. For example, Joseph Orlicky wrote *Material Requirement Planning*, published by McGraw-Hill, which has become the industry standard reference for almost all job shop planning requirements. This concept of planning and releasing work to the manufacturing shop floor is well accepted and, even today, many vendors are selling software based on the concept. From a dispatching point of view, this system takes into account only the general concept of first-in, first-out (FIFO) basis of dispatching. Dr. D. T. Phillips and G. L. Hogg published a paper entitled "A State-of-the-Art Survey of Dispatching Rules for Manufacturing Shop Operation", *International Journal of Production Research*, vol. 20, no. 1, pp. 27–45, which provides varying dispatching rules that can be used in a planning process. The International Business Machines (IBM) Corp. has a product called "Capacity Planning and Operation Sequencing System (CAPOSS)", described in education guide No. SR19-5004-0 published by IBM, that provides static dispatching functions in the form of deciding the next operation to be performed for an order after completion of a prior operation. This product provides the capability to change a dispatching process that is pre-assigned to another process. The limitation with this approach is that the system does not analyze the impact of a change to another operation. The system just provides the capability to change the operation and does not analyze the operational dynamics of one order affecting another in the downstream process.

What is needed is an expert system that is simple to use and is user friendly to analyze the dispatch decisions to be made and recommends the alternatives based on a given criteria; e.g., reduce the number of late orders or maximize throughput while accommodating for re-work orders received during the execution process.

Expert systems are a branch of computer science, generally referred to as artificial intelligence, which exhibits characteristics normally associated with human behavior including learning, reasoning, solving problems and so forth. More specifically, an expert system or "knowledge based" system uses certain rules and a database to provide a user interactive environment in the form of a "consultation dialogue", just as a user would interact with a human expert.

SUMMARY OF THE INVENTION

It is therefore an object of the present invention to provide an easy to use system that takes planned release of shop floor orders along with re-work orders and re-analyzes the planned release and recommends appropriate dispatching rules to achieve the objective in as optimal manner as possible.

It is another object of this invention to provide a computer implemented system that prompts the production planner with alternative decision capabilities through graphic displays.

The Automated Production Dispatch System with Feedback Control described in my U.S. Pat. No. 4,866,628 issued Sept. 12, 1989, analyzes shop dispatch rules using current status and a simulation system for the shop floor to establish the dispatch rules to be used to minimize tardiness. When re-work orders are introduced into the system, the shop floor orders have to compete for the same resources, and so the sequence for dispatch may have to be modified to meet the new demands on the shop floor resources. The system according to this invention provides the capability such that minimum impact is felt on existing orders while maintaining management objectives. The system provides feedback to the user and the upstream planning system if major changes need to be made on the shop floor schedules.

The present invention builds on the foundation of the Automated Production Dispatch System with Feedback Control described in U.S. Pat. No. 4,866,628, although this invention can be implemented and practiced independently. As mentioned above, this invention aims primarily at developing revised dispatch rules to be followed, and the associated sequence of operations to be followed after the introduction of re-work shop orders. The approach taken by this invention is repeated interactively and forms what may be characterized as a "bottoms up" approach to analyze the floor schedule taking into consideration the re-work orders and feeds the information to the original planning process. More specifically, the system automatically creates a list of alternative processes that any production order can follow and establishes optimum process flows in the event of introduction of re-work shop orders. The system automatically passes the information to the planning system which then re-calculates the revised order release sequence for the remaining orders in the release process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
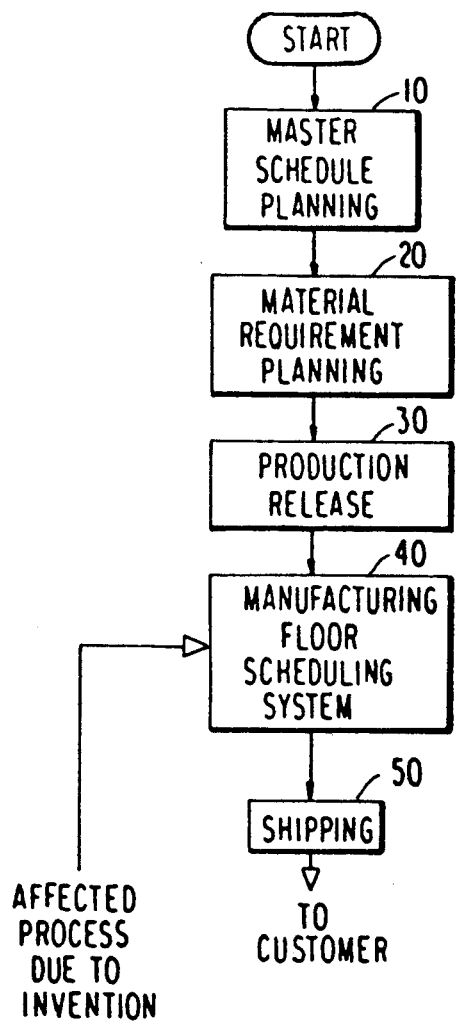
FIG. 1 is a system block diagram of the total manufacturing process from planning through execution.

Referring now to the drawings, and more particularly to FIG. 1, there is shown in functional block diagram form the normal set of processes that take place in a typical manufacturing environment from the time of planning through production and shipment. The process begins with the master schedule planning 10, where items are planned at the completed item level. This is followed by the Material Requirement Planning (MRP) system 20, where requirements of completed items are exploded into sub-components and planned. Next is the production release system 30, where shop orders planned at the MRP level 20 are set for releasing to the manufacturing shop floor. The next part of the system, the manufacturing floor control system 40, is the process affected according to the present invention. The last block is the shipping system 50 and is similar to any manufacturing enterprise.

Figure 2:
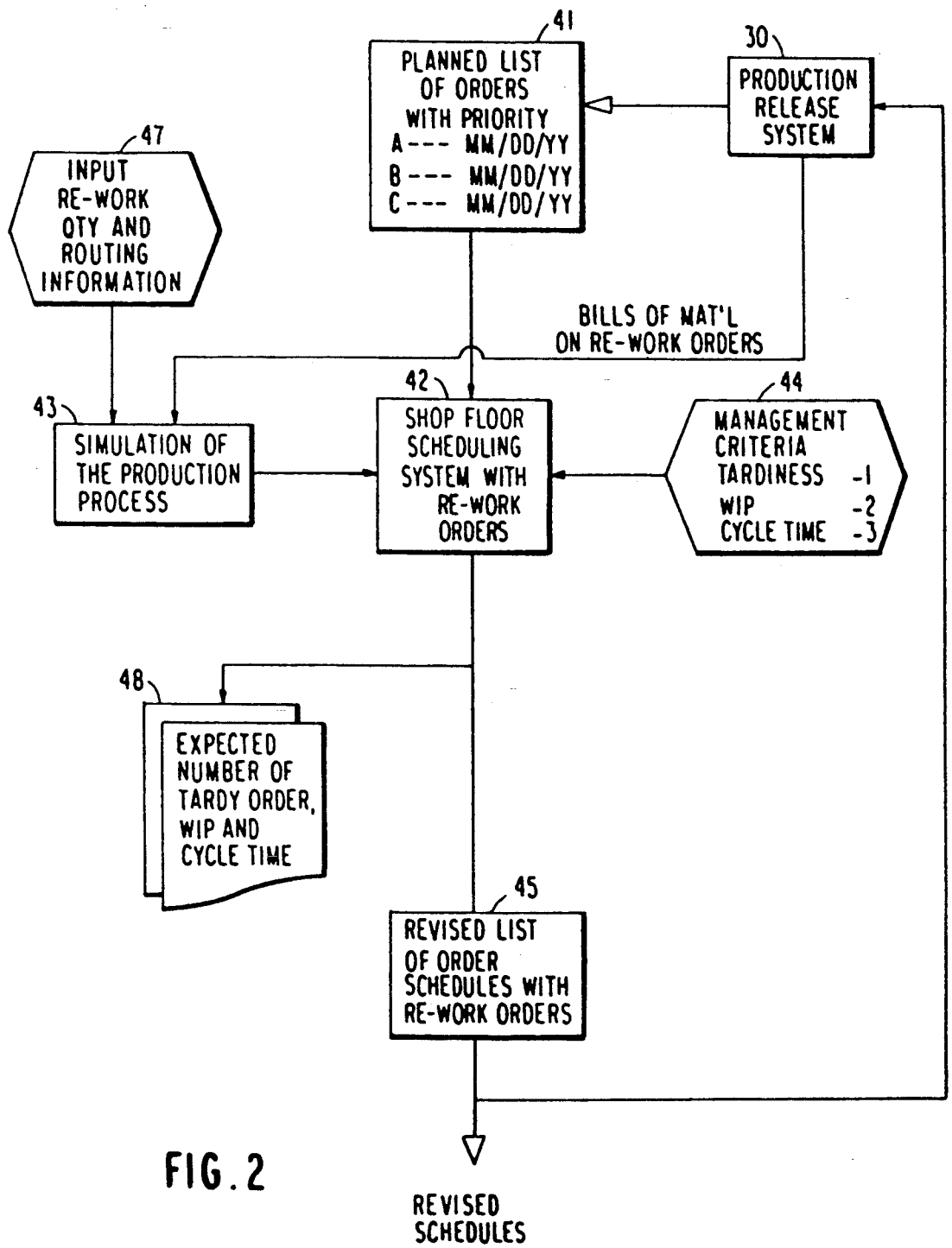
FIG. 2 is a block diagram that illustrates the shop floor scheduling system with re-work orders and the interfaces to a simulation system and production release system.

FIG. 2 illustrates the floor scheduling system 40 with re-work orders which constitutes that part of the manufacturing floor scheduling system and its relationship to the simulation and production release system. Here, the list of orders and their due dates 41 as received from the production and release system 30 are monitored and scheduled to include re-work shop orders by the production dispatch system 42 to ensure that orders, including re-work orders, are dispatched to optimize management criteria on tardiness, work-in-process (WIP) inventory, and cycle time. In the event re-work shop orders are introduced, the shop floor scheduling system 42 decides the optimum sequence to be followed. The system does this function by invoking the common function simulation system 43. The simulation system 43 is a commercially available product, as will be described in more detail below, and receives as inputs bill of materials data on re-work orders from the production release system and user input 47 on re-work quantity and routing information. Using planned priority rules, as set out in the list below, and based on the completed operations data, an analysis is made to determine the effect of production disruption due to re-work orders. Based on the resource data and availability, the system performs calculations to determine if the original planned quantities and dates can be met. If not, the system prompts the user to input priorities at 44 from among tardiness, work-in-process (WIP) inventory, and cycle time. This is done by displaying the original management criteria priority as developed by the production planning system and the user responds and provides necessary input. Based on the revised priority input by the user, the shop floor scheduling system 42 then recalculates the dispatch rule to be followed together with the sequence to complete the work schedule with sequence and priorities based on the results in block 45. This information is fed back to the production release system 30, providing the "bottoms up" approach to generating the planned list of orders 41, including the re-work orders. In addition to the revised list of order schedules 45, the shop floor scheduling system 42 also generates a list 48 of expected tardy orders, WIP inventory and cycle time to further aid the user in making decisions. The following floor dispatching rules are evaluated.

Dispatching Rules

1. First-in, first-out (FIFO) is a rule that dispatches jobs based on the order they arrive.

2. Earliest due date is a rule that dispatches jobs that have the earliest due dates.

3. Shortest Imminent Operation Time (SI) is a rule that dispatches jobs that have short processing time as opposed to long jobs. In order to have a limit on the maximum allowable time that a job can be waiting, this rule is modified such that jobs with short processing times are released provided no other job in the queue is made to wait more than a given specified amount of time. This is called the SI/T (truncated) rule.

4. Critical Ratio is the rule that dispatches jobs based on the ratio time remaining/time needed. The lesser the ratio, the more critical the job is and consequently gets a higher priority.

While FIG. 2 illustrates that part of the scheduling system 40 according to the invention as self contained, in the preferred embodiment of the invention, the system illustrated is actually integrated with the production planning system 30. The simulation function 43 can be accomplished with commercially available computer programs marketed under the name of "GEMS II", a Generalized Manufacturing Simulator published by Loadstone-II, Inc. of Bryan, Tex., or General Purpose Simulator System (GPSS), sold by the IBM Corporation. Information on GPSS may be had by reference to the book by Geoffrey Gordon entitled *The Application of GPSS V to Discrete System Simulation*, published by Prentice-Hall, Inc. in 1975. The GEMS II product is a network based technique which has the natural orientation to modeling manufacturing environments. The logic of GEMS II recognizes queues (in-process inventories, production backlogs, etc.) and assembly processes. Further, it recognizes competition among activities for limited resources, such as tools, fixtures, space and manpower. The IBM supported General Purpose Simulation System, on the other hand, is a flexible system which lends itself to simulating any manufacturing system.

The system according to the invention receives routing and bill of material information on re-work shop orders from any Shop Order Release System such as the one in COPICS (Communications Oriented Production Information Control System) product marketed by IBM Corporation. Order release is a critical application in COPICS because it provides an interface between two main planning systems, inventory management and manufacturing activity planning, and between planning systems and execution systems. The COPICS product is described in publication G320-1978 by IBM Corporation. In Chapter 7, volume V, of that publication, order release is described as having two major conceptual parts: The function to release shop orders for manufactured items, and the function required to communicate the need for purchased items to the purchasing systems. The COPICS publication addresses the functions required to release shop orders and establish the database records needed to maintain the information by which other systems will monitor and control the detailed feedback throughout the order. The system provides shop order reports with a list of open orders. The shop order data base retains information pertaining to routing and information on bills of material. So, when a re-work shop order is received, corresponding bills of material are retrieved from the database, and a user input has to follow. This information is used in the simulation system 43. Block 47 indicates the capability for inputting re-work quantity and routing information by the user. Block 41 describes the priority sequence as received from the production release system which does not include impact due to re-work orders; therefore, simulation of the production process with re-work orders is required. Those skilled in the art pertaining to simulation will recognize that the simulation of the manufacturing system can be accomplished in a number of ways. The practice of the invention is not limited to any specific simulation program, and programs other than those mentioned may be used. Box 42 describes the shop floor scheduling system with re-work orders based on the rules as stated above. Various rules are tested so that the revised sequence maintains, or best meets, the management criteria as stated in box 44. Revised schedules as developed are then fed back to the production release system 30. Other products having features similar to COPICS, such as the ones marketed by MSA or Cullinet, can also be used to interface with this invention.

Figure 3:
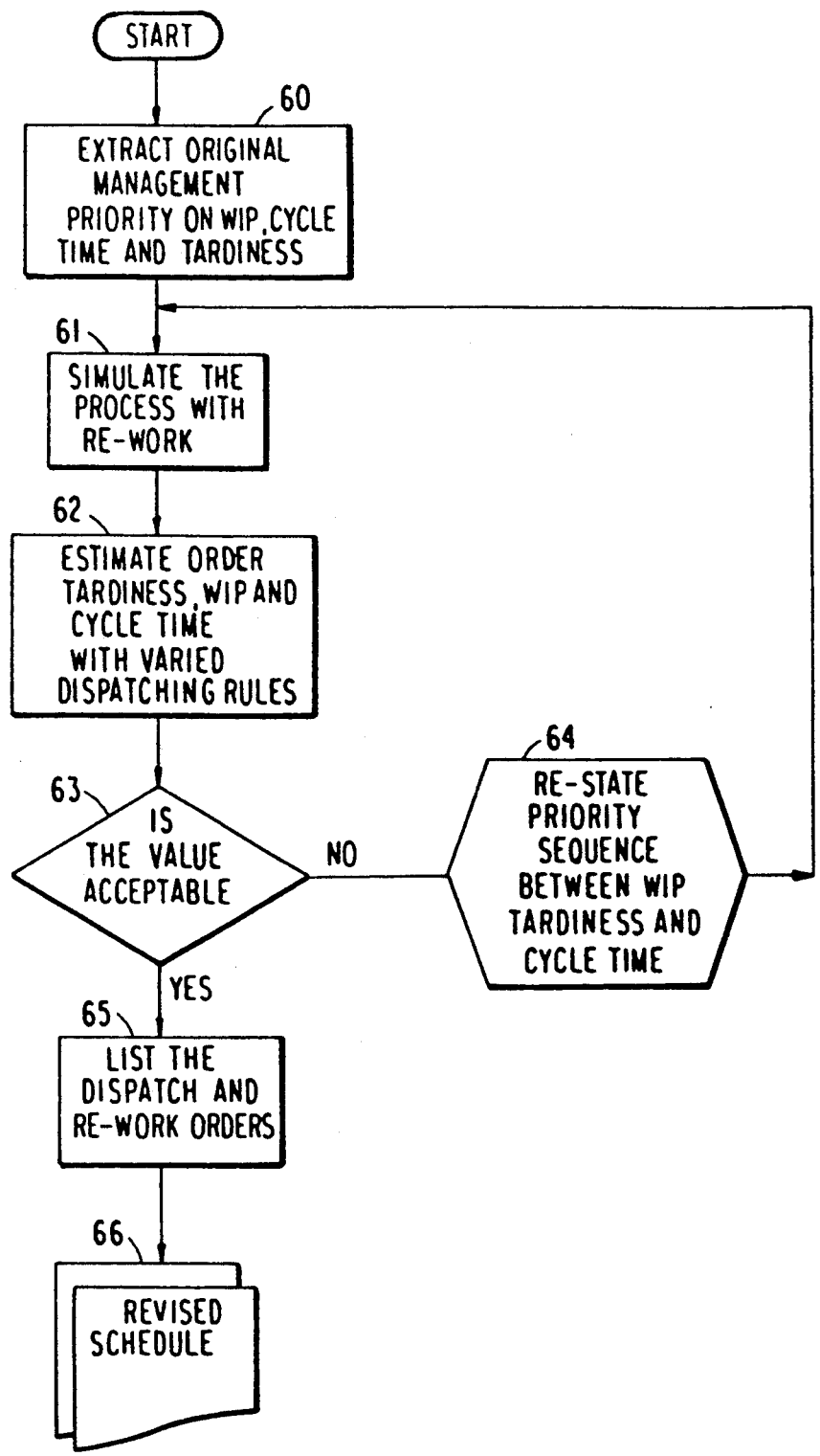
FIG. 3 is a flow chart that illustrates the logical flow of the decision process to arrive at a revised floor schedule in the event of introduction of re-work orders on the shop floor.

The logic of the process illustrated in FIG. 2 is shown by the flow chart of FIG. 3. With reference to FIG. 3, the process begins in function block 60 where the original management priority on work-in-process (WIP) inventory, cycle time and tardiness is extracted. The process is then simulated in function block 61 to determine how the process is affected through the end of the process. Based on the simulation, an estimate is made in function block 62 for order tardiness, work-in-process (WIP) inventory, and cycle time with varied dispatching rules. This estimate is then tested in decision block 63 to determine if it is acceptable. The estimate would be considered acceptable, for example, if the original release schedule is not significantly affected by the re-work orders. If the estimate is not acceptable, the system prompts the user to re-state the priority sequence in operation block 64, and then control passes to control block 61 to simulate the process again with re-ordered priorities input by the user.

When the test made in decision block 63 is positive, then, in function block 65, a list is prepared to develop the revised list of dispatch and re-work orders and a list prepared in function block 66.

Figure 4:
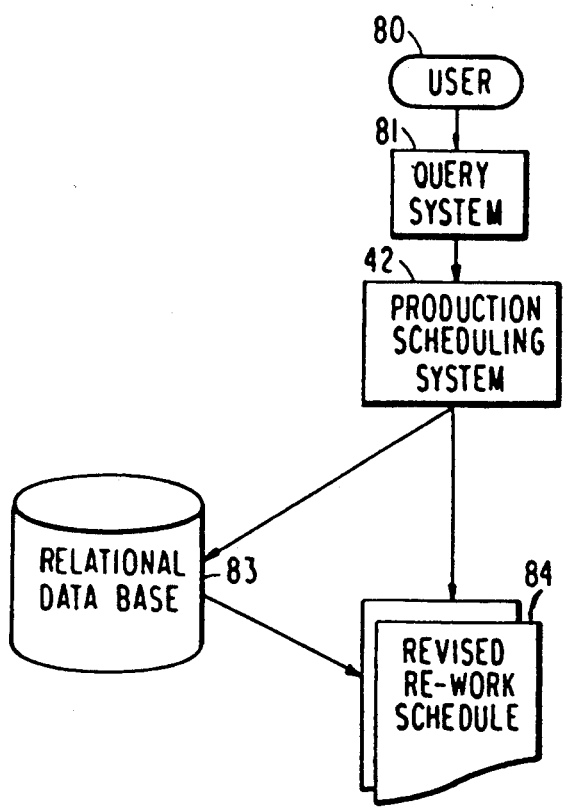
FIG. 4 is a block diagram that illustrates the relative position of the user with respect to the re-work scheduling system and a relational database.

FIG. 4 illustrates the key parts of the system from the user point of view. The key parts are the database 83 and the query system 81. The database can be any of several products currently available, but for the purposes of the preferred embodiment, IBM Corporation's Database 2 (DB2) is used. DB2 is a relational database system, but as will be understood by those skilled in the art that other databases, including hierarchical databases, could be used. The user 80 can query the current status, completion date and the priority sequence of any job in question using the query system 81. The query system 81 interfaces with the production scheduling systems 42 which accesses database 83 and provides the revised schedule and sequence for re-work shop orders.

When re-work orders are received for processing, the operations manager is very concerned about the expected completion time of the re-work order as well as other orders affected by the introduction of re-work orders. Having calculated the revised schedule, the production release system and the planning systems have to be notified in order to plan future orders. This decision making capability of the scheduling system based on user defined rules and objectives provides the artificial intelligence of the system.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An automated re-work order scheduling and dispatch system for implementation on a computer, said system providing for a customer re-work order schedule as orders arrive, to aid a user in making decisions that will improve a re-work scheduling process, comprising the steps of:
   monitoring production release orders and existing status of the orders on a shop floor;
   simulating the manufacturing environment subject to a disruption caused by an introduction of re-work orders based on defined management criteria of order tardiness, cycle time and work-in-process inventory; and
   providing the user with a capability for testing to see if a revised schedule based on said defined management criteria of tardiness, cycle time and work-in-process inventory is acceptable.

2. The automated re-work scheduling system as recited in claim 1 further comprising the steps of:
   providing the user with a capability to input re-work routing data to a simulation system while automatically accessing bill of material data from a production release system;
   prompting the user to define priorities among order tardiness, work-in-process inventory, and cycle time; and
   generating revised re-work schedules as well as schedules for regular orders for the manufacturing environment.

3. The automated re-work scheduling system as recited in claim 2 wherein said computer includes a database and a query system and further comprising the steps of:

capturing decision variables pertaining to re-work orders and associated data for the shop floor to facilitate the step of simulating the manufacturing environment;

responding to a user input via the query system to access decision variables captured in the database; and displaying an analysis of tested combinations to enable the user to view the results of revised schedules of the re-work orders and regular orders.

4. The automated re-work scheduling system as recited in claim 3 further comprising the step of displaying management criteria defined by the user correlated with said revised schedule of re-work orders and regular orders.

5. The automated re-work scheduling system as recited in claim 2 further comprising the step of feeding back the revised schedule to said production release system to generate a revised planned list of orders, including re-work orders.

* * * * *